(12) United States Patent
Triyoso et al.

(10) Patent No.: US 7,297,586 B2
(45) Date of Patent: Nov. 20, 2007

(54) GATE DIELECTRIC AND METAL GATE INTEGRATION

(75) Inventors: Dina H. Triyoso, Austin, TX (US); Olubunmi O. Adetutu, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 190 days.

(21) Appl. No.: 11/043,619

(22) Filed: Jan. 26, 2005

(65) Prior Publication Data

US 2006/0166425 A1 Jul. 27, 2006

(51) Int. Cl.
*H01L 21/8238* (2006.01)

(52) U.S. Cl. .............. 438/216; 438/591; 257/E21.639

(58) Field of Classification Search ............ 438/216, 438/591, 793, 794; 257/E21.639
See application file for complete search history.

(56) References Cited

U.S. PATENT DOCUMENTS

| | | | |
|---|---|---|---|
| 6,821,833 B1 * | 11/2004 | Chou et al. | 438/199 |
| 6,974,764 B2 * | 12/2005 | Brask et al. | 438/585 |
| 2003/0100155 A1 * | 5/2003 | Lim et al. | 438/197 |

OTHER PUBLICATIONS

Kunii, Yasuo et al.; "Energy-Saving Semiconductor Thin Film Technology"; Toyama Works, Semiconductor Equipment Division, Hitachi Kokusai Electric, Inc.; pp. 1-9, no date.

Kumar, Kiran et al.; "Optimization of sub 3 nm gate dielectrics grown by rapid thermal oxidation in a nitric oxide ambient"; Appl. Phys. Lett. 70(3), Jan. 20, 1997; pp. 384-386.

Sugiyama, Yoshihhiro et al; Approaches to Using $Al_2O_3$ and $HfO_2$ as Gate Dielectrics for CMOSFETs; FUJITSU Sci. Tech Journal, 39(1); Jun. 2003, pp. 94-105.

Kaneta, Chioko et al; "Nano-Scale Simulation for Advanced Gate Dielectrics", FUJITSU Sci. Tech. Journal 39(1), Jun. 2003; pp. 106-118.

Ogawa, Unryu et al.; "Plasma Oxidation and Nitridation System for 90- to 65- nm Node Processes"; Hitachi Review vol. 52 (2003), No. 3; pp. 161-165.

Gopalan, S. et al.; "Electrical and physical characteristics of ultrathin hafnium silicate films with polycrystalline silicon and TaN gates"; Applied Physics Letters, vol. 80, No. 23, Jun. 10, 2002; pp. 4416-4418.

Lucovsky, G.; "Ultrathin nitrided gate dielectrics: Plasma processing, chemical characterization, performance, and reliability"; IBM J. Res. Develop., vol. 43 No. 3, May 3, 1999; pp. 301-326.

Ghung, H.Y.A. et al.; "RTP-Grown Oxynitride Layers Meet Gate Challenges"; www.reed-electronics.com/semiconductor/article/CA446653; Jan. 15, 2005; 9 pages.

* cited by examiner

*Primary Examiner*—Chandra Chaudhari
(74) *Attorney, Agent, or Firm*—John A. Fortkort; Fortkort & Houston P.C.

(57) ABSTRACT

A CMOS device is provided which comprises (a) a substrate (103); (b) a gate dielectric layer (107) disposed on the substrate, the gate dielectric comprising a metal oxide; (c) an NMOS electrode (105) disposed on a first region of said gate dielectric; and (d) a PMOS electrode (115) disposed on a second region of said gate dielectric, the PMOS electrode comprising a conductive metal oxide; wherein the surface of said second region of said gate dielectric comprises a material selected from the group consisting of metal oxynitrides and metal silicon-oxynitrides.

17 Claims, 3 Drawing Sheets

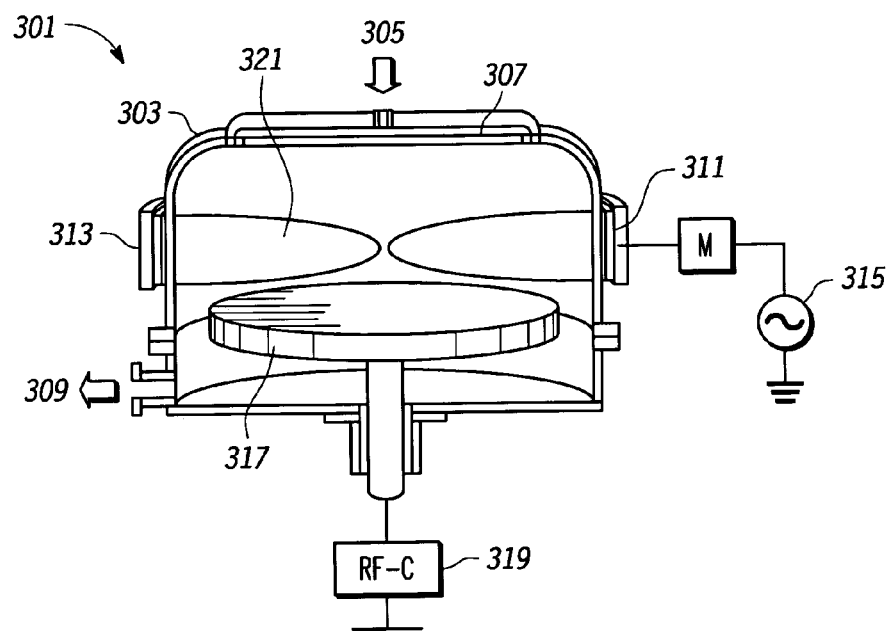
*FIG. 9*
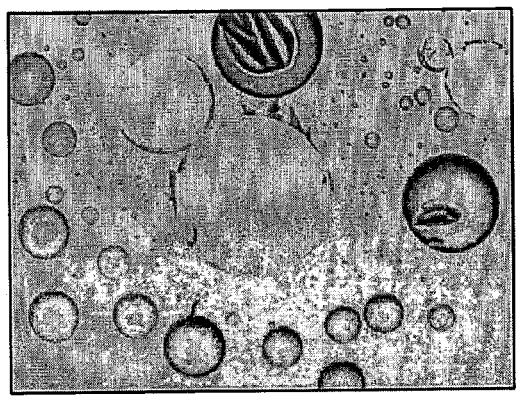 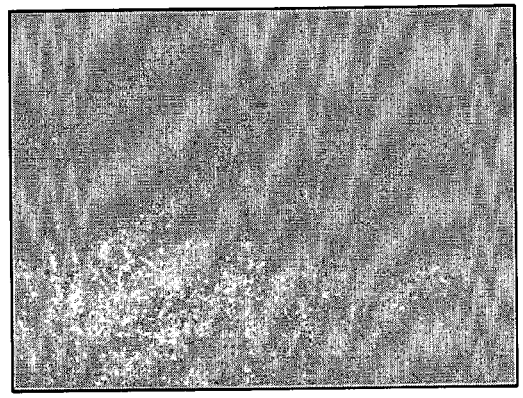
*FIG. 10*  *FIG. 11*

GATE DIELECTRIC AND METAL GATE INTEGRATION

FIELD OF THE DISCLOSURE

The present disclosure relates generally to CMOS devices, and more particularly to methods for forming gate structures therein.

BACKGROUND OF THE DISCLOSURE

Doped polysilicon is a commonly used gate electrode material in the construction of CMOS devices. The use of polysilicon is desirable insofar as it can be doped to achieve the desired work functions in the NMOS and PMOS gates. However, as CMOS devices are scaled to smaller dimensions, the use of polysilicon is attended by unacceptably high resistivities, reduced inversion charge densities, transconductance, and undesirable depletion of doped polysilicon gate electrodes, thus resulting in a detrimental increase in the thickness of the gate oxide layers. Problems also arise from dopant (e.g., boron) penetration by diffusion from the polysilicon into thin gate oxide layers.

As the equivalent gate oxide thickness (EOT) decreases below about 1.0 nm, the capacitance associated with the depletion layer in the polysilicon gate becomes an important limiting factor in EOT scaling. Hence, the use of a metal gate, and in particular, a dual metal gate, may be required when gate lengths of 50 nm or smaller are required. In a dual metal gate structure, an NMOS metal and a PMOS metal are used for the dual gates. However, current dual metal gate technology has unsolved problems in process integration.

The usual method for fabricating dual metal gate electrodes is to deposit the first metal on top of the gate dielectric, the later of which may be a high-k dielectric material. The first metal is then removed from one of the well regions, which may be the n-well or p-well region, using common lithographic and/or etch techniques. As a result, a portion of the gate dielectric is exposed in this region. The second metal is then deposited on top of the first metal and on the exposed portion of the gate dielectric. The first and second metals must be chosen carefully so that the two electrodes will exhibit the proper work functions. Unfortunately, even with the proper choice of metals, CMOS structures made by this process exhibit significant thermal stability issues.

There is thus a need in the art for a method for fabricating dual metal gate electrodes that overcomes the aforementioned problems. In particular, there is a need in the art for a method for fabricating CMOS structures and other devices having dual metal gate structures such that the resulting NMOS and PMOS gates will have the proper work functions and will exhibit appropriate thermal stability. These and other needs are met by the devices and methodologies described herein.

SUMMARY OF THE DISCLOSURE

In one aspect, a method for making a semiconductor device is provided. In accordance with the method, a semiconductor substrate is provided, and a high-k dielectric layer is formed on the substrate, the high-k dielectric layer having first and second regions. An NMOS layer stack is formed on the high-k dielectric layer in the first region, and a nitride layer is formed on the portion of the high-k dielectric layer within the second region. A PMOS layer stack is then formed within the second region.

In another aspect, a CMOS device is provided which comprises a substrate and a gate dielectric layer disposed on said substrate, the gate dielectric comprising a metal oxide. An NMOS electrode is disposed on a first region of said gate dielectric, and a PMOS electrode is disposed on a second region of said gate dielectric. The surface of said second region of said gate dielectric comprises a material selected from the group consisting of metal oxynitrides and metal silicon-oxynitrides.

These and other aspects of the present disclosure are described in greater detail below.

BRIEF DESCRIPTION OF THE DRAWINGS

FIG. 9 is an illustration of a Modified Magnetron Typed (MMT) plasma nitridation reactor useful for performing nitridation in accordance with the teachings herein;

FIG. 10 is a micrograph illustrating the thermal instability of the $HfO_2/IrO_x$ interface in a PMOS electrode based on these materials; and FIG. 11 is a micrograph illustrating the improved thermal stability conferred on a PMOS electrode of the type depicted in FIG. 10 through the use of nitridation in accordance with the teachings herein.

DETAILED DESCRIPTION

It has now been found that the aforementioned needs may be met through proper surface preparation of the high-k dielectric layer such that adhesion between this layer and the CMOS electrodes (and in particular, adhesion between the high-k dielectric layer and the PMOS electrode) is improved. In particular, it has been found that the aforementioned needs may be met through the nitridation of the high-k dielectric material in the PMOS region within such CMOS structures.

Without wishing to be bound by theory, it is believed that the thermal stability issues observed with CMOS structures having high-k gate dielectric materials and conductive metal oxide electrode structures arises from poor adhesion between the conductive metal oxide and the underlying high-k dielectric material. The use of a nitridation step overcomes this problem, apparently by improving adhesion between the two materials. At the same time, when properly implemented, nitridation does not adversely affect the work functions of the CMOS electrodes. Consequently, through the use of nitridation, gate structures may be fabricated for NMOS and PMOS stacks which exhibit excellent thermal stability and which have the desired work functions.

Figure 1:
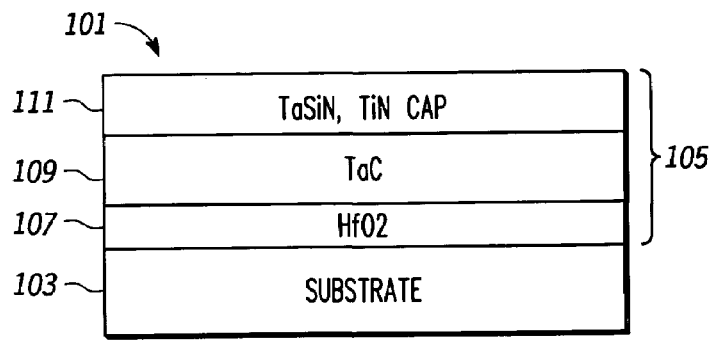
FIGS. 1-4 illustrate a first embodiment of a method useful for making CMOS devices in accordance with the teachings herein.

The methodologies described herein can be understood with reference to the first particular non-limiting embodiment illustrated in FIGS. 1-4 which depict the fabrication of a CMOS structure in accordance with the teachings herein. As shown in FIG. 1, the process commences with a layer stack 101 comprising a substrate 103 that has an NMOS layer stack 105 disposed thereon. The NMOS layer stack 105 comprises a high-k gate dielectric 107 and an NMOS metal electrode 109. In the particular embodiment depicted, the NMOS layer stack 105 also includes a cap layer 111 which serves to enhance the thermal stability of the NMOS metal electrode 109 and to protect the NMOS metal electrode 109 from being affected by the subsequent nitridation step. In some variations of this embodiment where the NMOS metal electrode 109 is sufficiently thick, however, a cap layer may not be required. In other variations, the cap layer may be extended down the side of the NMOS metal electrode 109 (it is to be noted, however, that this is typically not necessary since nitridation of the side of the NMOS metal electrode 109 does not typically affect the gate structure or work function of the electrode).

As discussed in greater detail later, various materials may be used in the layer stack 101, and other layers or materials beyond those illustrated may be optionally included in the structure. In the particular embodiment depicted, however, the high-k dielectric layer 107 comprises $HfO_2$, the NMOS metal electrode 109 comprises TaC, and the cap layer 111 comprises TaSiN, TiN, or a combination of the two.

Figure 2:
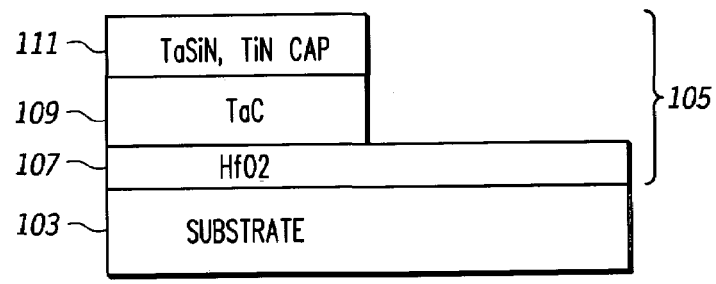

As shown in FIG. 2, in the next step of the process, the NMOS metal electrode 109 and the cap layer 111 are removed from the PMOS region of the CMOS device. This may be accomplished, for example, through the use of photolithography and selective etching of the NMOS layer stack 105.

Figure 3:
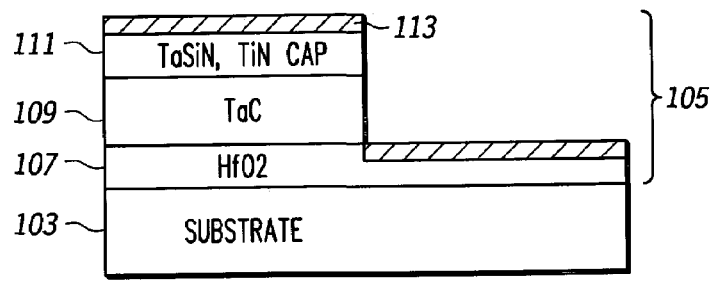

As shown in FIG. 3, a nitridation step is then performed, which results in nitridation of the exposed surface of the high-k gate dielectric 107 in the PMOS region. The nitrided surface is indicated as layer 113. Although layer 113 is shown as being formed in the cap layer 111 as well as in the PMOS region of the device, it is to be understood that, in actuality, nitridation may have little or no effect on the cap layer, particularly when the cap layer comprises a nitrogen-containing material. As discussed in greater detail below, nitridation may be accomplished through Modified Magnetron Typed (MMT) plasma nitridation, through a high temperature anneal in a nitrogen-containing atmosphere (e.g., an atmosphere containing NO, $N_2O$, $N_2$ or $NH_3$), or by other suitable means.

Figure 4:
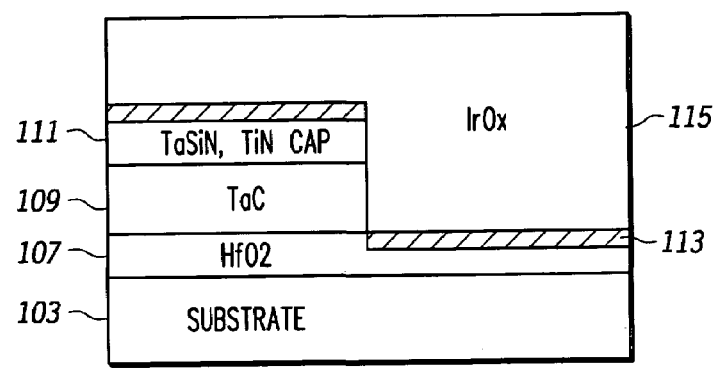

As shown in FIG. 4, the PMOS metal electrode 115 is then deposited directly on the nitrided PMOS gate dielectric and overlies the metal electrode in the NMOS region. Typically, the PMOS metal electrode 115 is allowed to extend over the NMOS region of the CMOS device, since this avoids the extra masking and etching steps that might otherwise be required to remove it from the NMOS region, and since this does not adversely affect the functionality of the CMOS device. However, it will be appreciated that, if desired, appropriate masking and etching steps could be employed to contain the PMOS metal electrode 115 within a desired area (e.g., within the PMOS region of the device).

Figure 5:
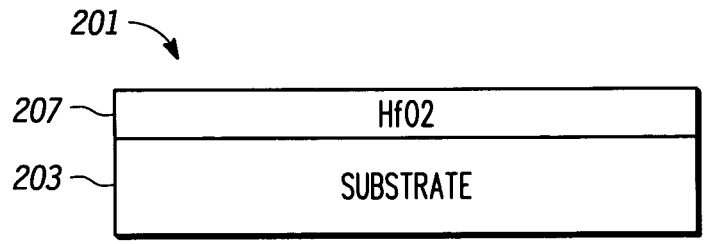
FIGS. 5-8 illustrate one embodiment of a method useful for making CMOS devices in accordance with the teachings herein.

FIGS. 5-8 illustrate a second particular, non-limiting embodiment of a method for making CMOS structures in accordance with the teachings herein. As shown in FIG. 5, the method begins with a layer stack 201 comprising a substrate 203 with a gate dielectric 207 disposed thereon. In the particular example depicted, the gate dielectric 207 is a monolithic layer of $HfO_2$.

Figure 6:
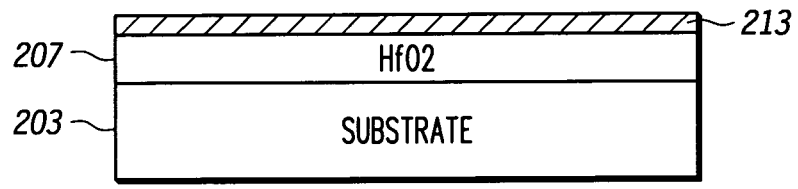
Figure 7:
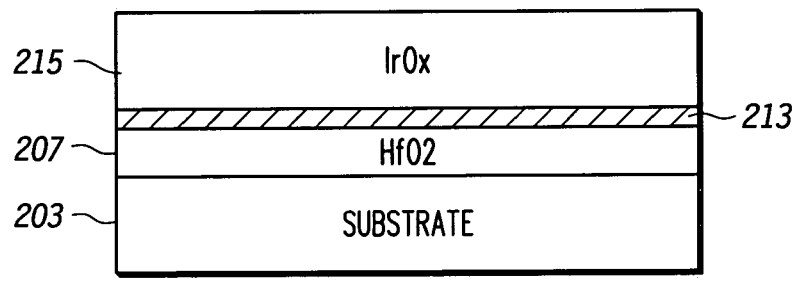

As shown in FIG. 6, the exposed surface of the gate dielectric layer 207 is then subjected to nitridation. The resulting nitrided surface is depicted as layer 213. A PMOS gate electrode 215 is then formed over the gate dielectric layer 207 as shown in FIG. 7. It is to be noted that, although FIG. 6 depicts layer 213 as extending over both the PMOS and NMOS regions of the device, in some variations of the method, the nitrided surface 213 may be removed from the NMOS region through suitable masking and etching steps. In other variations, a hard mask may be employed to limit nitridation to the PMOS region of the device, and this hard mask may be removed in a subsequent processing step.

Figure 8:
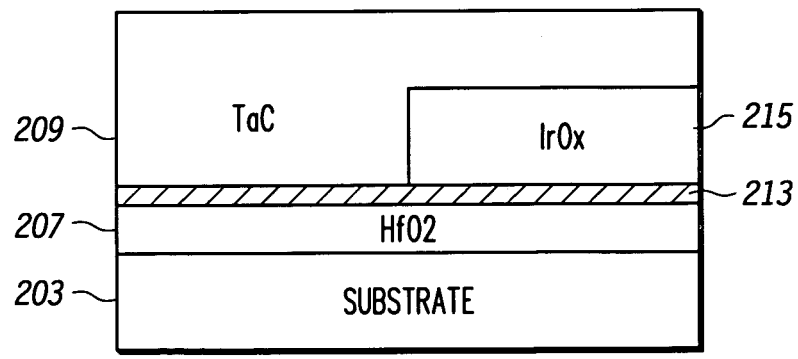

As shown in FIG. 8, the PMOS electrode 215 is then subjected to masking and etching to selectively remove it from the NMOS region of the device. The NMOS metal electrode 209 (which, in the particular embodiment illustrated, is TaC) is then formed over the gate dielectric 207 (and the nitrided surface thereof) in the NMOS region of the device, and overlaps the PMOS metal electrode 215 in the PMOS region of the device. As with the previous embodiment, such overlap is normally permitted, since it does not typically have an adverse affect on the functionality of the CMOS device. However, one skilled in the art will appreciate that, if desired, appropriate masking and etching steps could be employed to restrict the NMOS metal electrode 209 to a particular region of the CMOS device so that no overlap exists.

The nitridation step described in the above noted methodologies may utilize, or be effected by, a number of processes as are known to the art. These include, without limitation, various thermal and anneal processes, plasma-enhanced anneal processes, Rapid Thermal Anneal (RTA), a Slot Plane Antenna (SPA) plasma process, a Radial Line Slot Antenna (RLSA) microwave plasma process, and Modified Magnetron Typed (MMT) plasma nitridation.

The use of MMT plasma nitridation in the methodologies described above is preferred, due in part to the uniformity of the nitridation and the minimal damage this method causes in the surface undergoing nitridation. FIG. 9 depicts one example of an MMT reactor that is suitable for use in this process. The MMT reactor 301 depicted therein comprises a reaction chamber 303 equipped with a gas inlet 305 which is in open communication with a gas injection plate 307, and an exhaust line 309 which is in open communication with the interior of the chamber. An annular RF electrode 311 is provided on the exterior of the reaction chamber 303, along with one or more permanent magnets 313. An RF generator 315 is provided to power the RF electrode. The interior of the reaction chamber 303 is provided with a susceptor 317 on which a sample to be nitrided is placed. The susceptor 317 is in electrical communication with a radio-frequency impedance control mechanism (RF-C) 319.

The MMT reactor 301 generates magnetron discharge plasma 321, through the interaction of magnetic force lines from the permanent magnet 313 and the RF electric fields applied to the annular RF electrode 311. The plasma created by this reactor has an electron temperature near the substrate that is less than 1 eV and that is practically independent of the RF power entering the reaction chamber. Consequently, a low electron temperature can be maintained, even when the plasma density is increased to a high level by high RF power. Also, the energy of the ions impinging on the substrate surface can be controlled over a wide range by adjusting the RF-C (radio-frequency impedance control mechanism) that is provided on the lower part of the susceptor in the MMT reactor 301.

The methodologies described herein have a number of benefits over conventional processes used to fabricate CMOS structures. For example, the particular embodiments depicted in FIGS. 1-4 and 5-8 permit the integration of $HfO_2$/TaC for NMOS and $Hf_xO_yN_z$ (hafnium oxy-nitride)/conductive oxides for PMOS, wherein x, y, z>0. This combination of materials is particularly desirable in light of the physical and electrical properties they possess. The methodologies described herein also allow NMOS and PMOS devices to be fabricated within a CMOS structure that have the proper work functions (the work function of the NMOS electrode will typically be about 3.8 to about 4.5 eV, and the work function of the PMOS electrode will typically be about 4.7 to about 5.2 eV).

Moreover, as previously noted, the methodologies described herein overcome the thermal stability issues noted at the gate dielectric/PMOS electrode interface. This effect can be appreciated with respect to the micrographs shown in FIGS. 10 and 11. FIG. 10 is a micrograph showing a surface of a PMOS metal gate electrode of the general type shown in FIG. 4 without a nitrided gate dielectric, and after a 5 second thermal anneal in a nitrogen ($N_2$) atmosphere at 1000° C. The particular CMOS device that the micrograph was taken from had $HfO_2$ as the gate dielectric, $IrO_x$ as the electrode material, TaSiN as a cap layer, and a layer of polysilicon overlying the CMOS device as a silicide-forming layer. FIG. 11 is a micrograph of the same PMOS electrode subjected to the same conditions, except that the gate dielectric was first subjected to nitridation in accordance with the teachings herein. As seen from the micrographs, the PMOS electrode of FIG. 10 exhibited serious thermal stability issues during the thermal anneal, as indicated by the formation of bubbling and delamination. By contrast, no thermal instability was evident in the PMOS electrode of FIG. 11.

The various components of the structures depicted herein, including the high-k dielectric material, the NMOS and PMOS metal electrodes, and the cap layers, may be formed through a variety of processes. These include Atomic Layer Deposition (ALD), Chemical Vapor Deposition (CVD), Physical Vapor Deposition (PVD), Radical Assisted Atomic Layer Deposition (RA-ALD), Plasma Enhanced Atomic Layer Deposition (PEALD), Pulsed Laser Deposition (PLD), Molecular Beam Deposition (MBD; also called Molecular Epitaxial Deposition or MED), sputter deposition, electrolytic deposition, and other suitable techniques as are known to the art, including various combinations or variations of the foregoing.

Various etching compositions may be used for the selective removal of portions of the NMOS or PMOS electrodes in accordance with the teachings herein. These etching compositions may include various acids, such as HF, HBr, HI, $H_3ClO_4$, and $H_2SO_4$, various solvents, such as tetrahydrofuran (THF) and dimethyl sulfoxide (DMSO), various chelating agents, such as diamines and beta-diketones, and/or various surfactants, such as glycol and glycerol.

Various materials may be used in the construction of the PMOS metal electrode in accordance with the teachings herein. These materials include, without limitation, conductive metal oxides, such as iridium oxides, rhodium oxides, ruthenium oxides, rhenium oxides, and osmium oxides, and various combinations of the foregoing with their base metals, either as mixtures, alloys or multilayer structures.

Various materials may be used in the construction of the NMOS metal gate electrodes in accordance with the teachings herein. These materials include, without limitation, TaC and the various materials described above for the PMOS electrode. In some embodiments, the NMOS electrode may have the general composition $MO_x$ and the PMOS electrode may have the general composition $MO_y$, wherein M is an appropriate metal (such as such as iridium, rhodium, ruthenium, rhenium, or osmium or the like), and wherein the values of x and y are chosen to provide electrodes having the proper work functions.

Various materials may be used in the construction of the high-k dielectric layers in accordance with the teachings herein. These materials include, without limitation, hafnium oxide ($HfO_2$), zirconium oxide ($ZrO_2$), $Al_2O_3$, hafnium oxide silicates $(HfO_2)_{1-x}(SiO_2)_x$, zirconium oxide silicates $(ZrO_2)_{1-x}(SiO_2)_x$, hafnium oxide aluminates $(HfO_2)_{1-x}(AlO_{1.5})_x$, zirconium oxide aluminates $(ZrO_2)_{1-x}(AlO_{1.5})_x$, titanium oxide ($TiO_2$), tantalum oxide ($Ta_2O_3$), zirconium oxide ($ZrO_2$), yttrium oxide ($Y_2O_3$), lanthanum oxide ($La_2O_5$), and various aluminates and silicates of the foregoing. The high-k dielectric layer may also comprise nanolaminates of various alloys. It will be appreciated that the stoichiometries of the foregoing materials may vary somewhat, either incidentally or by design. Moreover, in some applications, the need for a nitridation step may be reduced or eliminated by the formation or deposition of a layer of material over the gate oxide which contains an appropriate nitrogen content. Alternatively, in some applications, the need for a nitridation step may be reduced or eliminated by forming the gate dielectric in such a way that it inherently contains (or its surface contains) an appropriate nitrogen content, as by doping it with a nitrogen-containing material or including a nitrogen-containing material in its composition.

Various substrates may be used in the methodologies described herein. The substrate may comprise mono-crystalline silicon, or other types of semiconductor materials as are known to the art, including, for example, silicon carbon, silicon germanium, germanium, type IIIV semiconductor materials, type IIVI semiconductor materials, and combinations thereof. The substrate may also comprise multiple layers of different semiconductor materials or Silicon-On-Insulator (SOI). In some embodiments, the semiconductor material of substrate may be strained, as through the application of compressive strain or tensile strain.

Various other processing steps may also be used in the methodologies described herein, beyond those specifically enumerated above. For example, in some situations, nitridation or oxynitridation of the substrate prior to formation of the gate dielectric layer thereon may be beneficial. Such nitridation or oxynitridation may improve the thermal stability of the device, reduce the equivalent oxide thickness (EOT) of the dielectric layer, or have other desirable effects.

Various cleaning steps may also be employed to prepare the substrate for formation of the gate dielectric material. For example, the substrate may be prepared for formation of the gate dielectric layer through piranha cleaning, dipping in HF, and rinsing with deionized water, followed by a thermal anneal in a nitrogen-containing atmosphere. The gate dielectric material may also be deposited on a thin oxide, oxynitride or etched back oxide layer.

The devices described herein may also have additional layers or material beyond those specifically noted above. For example, one or more barrier layers may be employed between the high-k dielectric gate and the substrate. Also, various layers may be added to the device after the NMOS and PMOS metal gate electrodes are formed. For example, in some embodiments, a layer of polysilicon (which may be doped or undoped) may be deposited over the NMOS and PMOS metal gate electrodes to permit formation of a self-aligned silicide layer.

Methods for improving the thermal stability of CMOS devices, and in particular, the PMOS electrodes therein, have been provided herein, along with improved devices made in accordance with these methods. It will be appreciated, however, that the principles described herein may have applications in other applications where adhesion between metal oxide dielectric materials (such as, for example, hafnium oxides) and conductive metal oxides (such as, for example, $IrO_x$), or the thermal stability of an interface formed by these materials, is an issue. One non-limiting example of such an application is in MRAM devices.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a semiconductor substrate;
   forming a high-k dielectric layer on the substrate, the high-k dielectric layer having first and second regions;
   forming an NMOS layer stack on the high-k dielectric layer in the first region, and then subjecting the high-k dielectric layer to nitridation within the second region; and
   forming a PMOS layer stack within the second region.

2. The method of claim 1 wherein, prior to the nitridation step, the NMOS layer stack is formed over the first and second regions of the device and is subjected to masking and etching steps to remove it from the second region of the device.

3. The method of claim 1 wherein, after the nitridation step, the PMOS layer stack is formed over the first and second regions of the device and is subjected to masking and etching steps to remove it from the first region of the device.

4. The method of claim 1 wherein, prior to the nitridation step, a hard mask is formed over the first region of the device.

5. The method of claim 4, wherein the hard mask is removed after the nitridation step and before the step of forming the PMOS layer stack.

6. The method of claim 1, wherein the high-k dielectric layer comprises a metal oxide.

7. The method of claim 1, wherein the high-k dielectric layer comprises $HfO_2$.

8. The method of claim 1, wherein the NMOS layer stack comprises a layer of TaC.

9. The method of claim 8, wherein the NMOS layer stack further comprises a layer of a material selected from the group consisting of TaSiN and TiN.

10. The method of claim 1, wherein the PMOS layer stack comprises a conductive metal oxide.

11. The method of claim 10, wherein the PMOS layer stack comprises an iridium oxide.

12. The method of claim 1, further comprising the step of forming a diffusion barrier layer between the substrate and the high-k dielectric layer.

13. The method of claim 1, wherein the step of subjecting the high-k dielectric layer to nitridation within the second region involves use of a Modified Magnetron Typed (MMT) plasma reactor.

14. The method of claim 13, wherein the MMT plasma reactor is provided with a nitrogen-containing atmosphere.

15. The method of claim 14, wherein the nitrogen-containing atmosphere comprises a gas selected from the group consisting of ammonia and oxides of nitrogen.

16. The method of claim 1, wherein the step of subjecting the high-k dielectric layer to nitridation within the second region involves a thermal anneal in a nitrogen-containing atmosphere.

17. The method of claim 16, wherein the nitrogen-containing atmosphere comprises a gas selected from the group consisting of ammonia and oxides of nitrogen.

* * * * *